March 4, 1969 J. J. ANDREA 3,431,509

PHASE LOCKED LOOP WITH DIGITALIZED FREQUENCY AND PHASE DISCRIMINATOR

Filed Jan. 8, 1968

INVENTOR.

JOHN J. ANDREA

BY Donald W. Phillion

ATTORNEY

United States Patent Office 3,431,509

Patented Mar. 4, 1969

3,431,509
PHASE LOCKED LOOP WITH DIGITALIZED FREQUENCY AND PHASE DISCRIMINATOR

John J. Andrea, Cedar Rapids, Iowa, assignor to Collins Radio Company, Cedar Rapids, Iowa, a corporation of Iowa Filed Jan. 8, 1968, Ser. No. 696,205
U.S. Cl. 331—25 7 Claims
Int. Cl. H03b *3/04;* H03k *9/06;* H03d *13/00*

ABSTRACT OF THE DISCLOSURE

In a phase locked loop a digitalized frequency and phase detector employing first and second flip-flops which are caused to assume first states by a VCO signal of frequency $f_{vco}$ and a reference signal of frequency $f_r$, respectively. First and second logic means are responsive to the two outputs of said first and second flip-flop means and to a said third flip-flop means to cause said third flip-flop means to act as a frequency discriminator by remaining substantially continuously in a first state when $f_{vco}>f_r$, and substantially continuously in its second state when $f_{vco}<f_r$, and to act as a phase detector by alternating states when $f_{vco}=f_r$ This invention relates generally to combination phase and frequency discriminator circuits and, more particularly, to circuits which function to detect and correct both frequency and phase deviation with a high degree of accuracy and without spurious responses in the frequency discriminating function.

Figures 1, 2, 3:
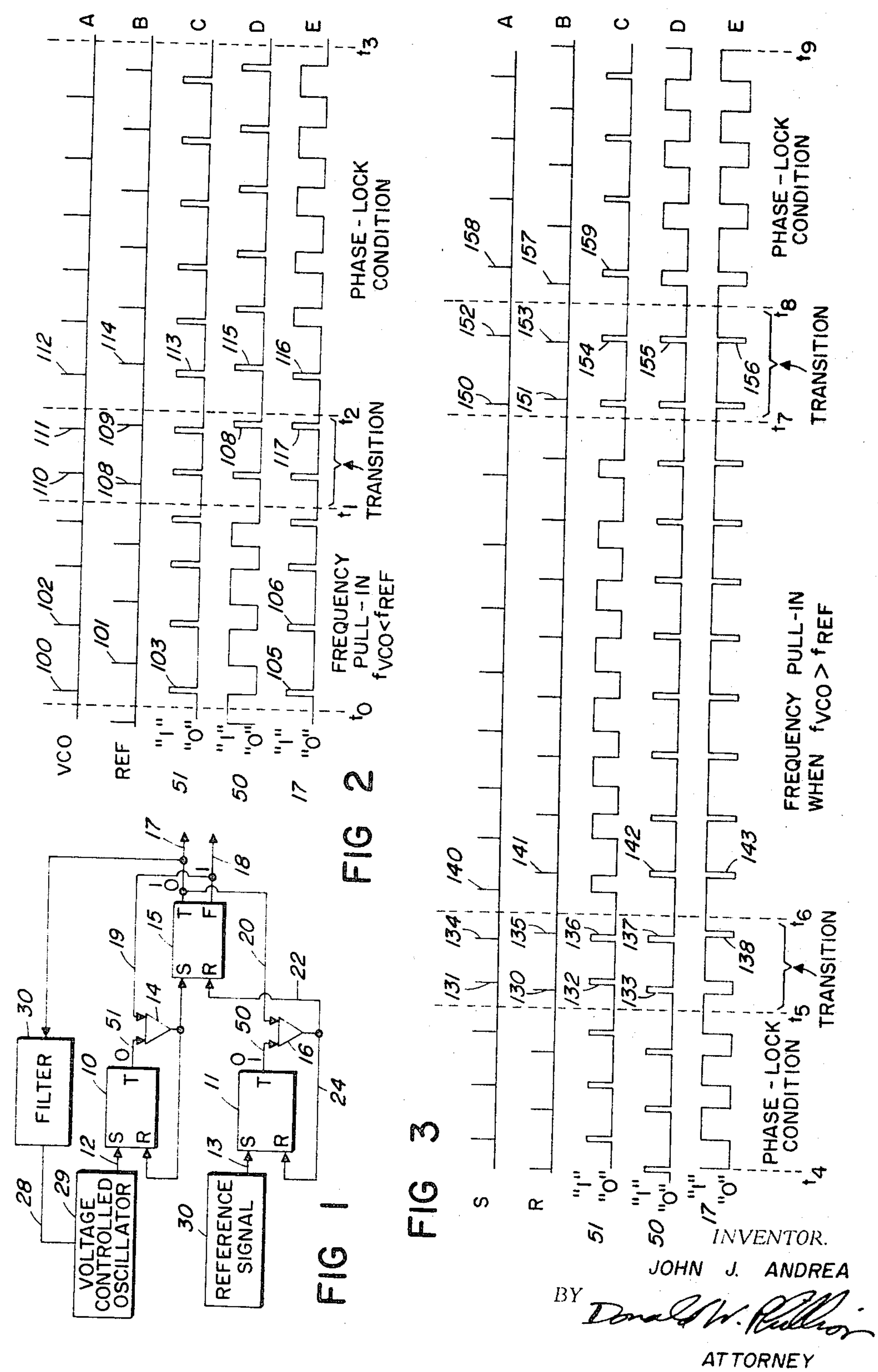

There are in the prior art digitalized frequency and phase discriminator circuits. A typical such circuit comprises two inputs, one for the received signal from a variable controlled oscillator (VCO) for example, and the other for the reference signal. Each of these two input circuits includes a flip-flop, the output of which is supplied to one of the two leads of a third flip-flop circuit. An inverter usually connects the output of each of the two input flip-flops back to its own reset input. Thus each time a positive input pulse of the received VCO input signal is applied to the associated input flip-flop, the said input flip-flop is set and will produce an output which will set the third flip-flop. The inverter at the output of said input flip-flop will, however, function to immediately thereafter reset said input flip-flop in preparation for the next received positive pulse of the received signal. The other input flip-flop associated with the reference signal operates in much the same manner. Thus the third flip-flop circuit will adopt one of two states depending on which of the two input signals, i.e., the received signal or the reference signal, has supplied the last positive pulse, and will remain in such state until the other of said input signals supplies a positive pulse.

The output of said third flip-flop is then ordinarily integrated and filtered to produce a D-C voltage which controls the frequency $f_{vco}$ of said received input signal and will adjust said frequency until it is equal to the frequency $f_{ref}$ of the reference signal. In this manner frequency discrimination and control is obtained. There is a problem in this type digitalized discriminator circuit, however, in that spurious indications of equalized frequency occur. The problem arises in the following manner. Assume that ordinarily the frequency of the VCO is at its desired value when the integrated D-C output of the third flip-flop is five volts. Assume further, that before frequency synchronization was obtained, $f_{vco}$ was considerably less than $f_{ref}$ so that the integrated D-C output of the third flip-flop was considerably below the positive five volts.

As the $f_{vco}$ increases towards $f_{ref}$, certain integral ratios of the $f_{vco}$ to $f_{ref}$ must be passed. For example, as $f_{vco}$ increases it will acquire a ratio of 2:3 with respect to $f_{ref}$ and, subsequently, will acquire ratios of 3:4, 5:6, 7:8, 9:10, and so on, until a 1:1 ratio is obtained. With the 1:1 ratio frequency synchronization has occurred and the phase discrimination function can begin to obtain phase lock between the two signals.

At the occurrence of these integral ratios of $f_{vco}$ to $f_{ref}$ there will occur a beat frequency whose period is proportional to the multiple of the numerator and denominator of the said ratio. For example, if the ratio of the period of $f_{vco}$ to the period of $f_{ref}$ is 4:5 then the period of the beat frequency is 20. Such a beat frequency is the result of a repetitive pattern in the output of the frequency discriminator, which repetitive pattern contains a D-C component. At certain occurrences of relatively low integral ratios of $f_{vco}$ *to* $f_{ref}$ the D-C component contained therein is of the proper value to maintain $f_{vco}$ so that the ratio of $f_{vco}$ to $f_{ref}$ remains at said integral value. Actually the aforementioned D-C voltage is contained in a relatively small range of D-C voltage within which range stability of operation of the frequency control system exists. More specifically, under such a condition should the phase of the CVO with respect to the reference signal shift in one direction, the D-C voltage will change in such a direction as to shift the phase of the VCO back to its original position. Similarly, should the phase of the VCO signal shift in the other direction, the D-C output component will also change in such a manner as to cause the phase of the VCO signal to shift back to its original position. Thus there has occurred a spurious phase lock.

Several such spurious phase locks can occur during the pull-in of the frequency over the several integral ratios of $f_{vco}$ to $f_{ref}$.

Several schemes have been devised to bring $f_{vco}$ past these spurious lock-in points until a 1:1 ratio is obtained between $f_{vco}$ and $f_{ref}$, at which time the phase discriminating function of the circuit becomes operative and phase lock occurs.

A primary object of the invention is to provide a combination frequency and phase discriminator in which the possibility of spurious phase lock during frequency pull-in is virtually eliminated.

A second aim of the invention is to provide a relativley simple digitalized combination frequency and phase discriminator in which the occurrence of spurious phase lock during frequency pull-in is minimized.

A third object of the invention is a combination frequency and phase digitalized discriminator in which the D-C output thereof is always substantially at either a maximum or a minimum value during frequency pull-in, in accordance with whether $f_{vco}$ is above or below $f_{ref}$.

A fourth object of the invention is a digitalized combination frequency and phase discriminator circuit which operates as a frequency discriminator during frequency pull-in without the occurrence of spurious phase locks, and which automatically changes to a phase discriminator when frequency pull-in is completed.

A fifth purpose of the invention is the improvement of digitalized combination frequency and phase discriminators generally.

In accordance with the invention there is provided first and second input flip-flop means and a third output flip-flop means. A first AND gate means is responsive to a first output of the third flip-flop means and the output of the first flip-flop means to reset said first flip-flop means and to set said output flip-flop means. Second AND gate means is responsive to the output of the second flip-flop means and the second output of the third flip-flop means to reset said second flip-flop means and said third flip-flop means.

Inherent in the structure mentioned above are three different sequences of operation of the various flip-flops. The first and second of these sequence of operations will produce, respectively, a relatively constant high voltage and a relatively constant low voltage on a given one of the output leads of said third flip-flop circuit when $f_{vco}$ is either above or below $f_{ref}$. Said high and low voltage levels are of the proper values and polarities to pull in $f_{vco}$ to equal $f_{ref}$. The third sequence of operation functions to produce a voltage on said given output lead of said third flip-flop which is somewhere in between the high and low voltage levels mentioned above. This third voltage level functions to maintain phase lock between the VCO signal and the reference signal once frequency pull-in has been accomplished.

The above-mentioned and other objects and features of the invention will be more fully understood from the following detailed description thereof when read in conjunction with the drawings in which:

FIG. 1 is a logic diagram of the invention;

FIG. 2 is a first set of waveforms illustrating the change of the operational sequence from that which occurs during frequency pull-in when $f_{vco}$ is above the $f_{ref}$ to a condition of phase lock; and FIG. 3 is another set of waveforms showing the transition of the sequence of operation from a phase lock condition to the sequence of operation which exists when $f_{vco}$ is less than $f_{ref}$.

*1. Frequency pull-in form $f_{vco}<f_{ref}$ to phase-lock condition*

In describing the invention, a particular sequence of operation of the circuit of FIG. 1 will be assumed. Specifically, such sequence of operation is that shown to the left of time $t_1$ in FIG. 2, wherein $f_{vco}$ is less than $f_{ref}$.

Assume that the following conditions exist in the circuit at the beginning of this discussion, the output 51 of flip-flop 10 contains a "0" (low level) at time $t_0$ in FIG. 2C, the output terminal 50 of flip-flop 11 contains a "1" (upper level) at time $t_0$ in FIG. 2D, and the output lead 17 of flip-flop 15 contains a "0" (low level) at time $t_0$ in FIG. 2E. The next pulse to be entered into the system is pulse 100 of curve FIG. 2A from VCO source 29 of FIG. 1.

This pulse 100 produces the following effects. A "1" is produced on output lead 51 of flip-flop 10. Since there is already a "1" on output lead 18 of flip-flop 15 (input lead 19 of AND gate 14), there is a "1" produced at the output of AND gate 14 which performs two functions. Firstly, said "1" resets flip-flop 10 back to a "0" output with the resulting effect that the pulse 103 of FIG. 2C appeared momentarily on output lead 51. The second effect of the "1" on the output of AND gate 14 is to set flip-flop 15 so that a "1" appears on the output lead 17 thereof. The "1" on the output lead 17 is impressed to input 20 of AND gate 16. Since there's already a "1" on the other input 50 of AND gate 16, a "1" is produced on the output of AND gate 16 which in turn performs two functions. The first function is to reset the flip-flop 11 so that a "0" is produced on the output lead 50 thereof, as shown in FIG. 2D, at the time corresponding to pulse 100.

The second function of the "1" on the output of AND gate 16 is to reset flip-flop 15 to put a "1" on the output lead 18 thereof, which means that a "0" appears on output lead 17 of flip-flop 15.

It will be observed that the net effect of the above sequence on the output lead 17 is a short term positive pulse 105, which pulse functions to raise the average D-C level of the output signal appearing on lead 17 only a negligible amount from the lower level shown in FIG. 2E at time $t_0$.

The next pulse to be supplied to the system of FIG. 1 is a reference pulse 101, as shown in FIG. 2B. The pulse 101 produces only one effect, and that effect is to create a "1" in output lead 50 of flip-flop 11. Since there is already a "0" on output lead 17 of flip-flop 15, there is no output from AND gate 16.

The next input pulse to the circuit is pulse 102 from VCO source 29 of FIG. 1. Pulse 102 is shown in FIG. 2A and performs essentially the same functions as pulse 100. More specifically, pulse 102 produces the following sequence of operation. A "1" is produced on output lead 51 of flip-flop 10. Since there is already a "1" on output lead 18 of flip-flop 15, AND gate 14 produces a "1" on its output which functions to reset flip-flop 10 to produce "0" on output on lead 51 and also to set flip-flop 15 to produce a "1" on output lead 17 thereof.

The "1" on output lead 17 of flip-flop 15 is supplied to the input 20 of AND gate 16. Since a "1" already exists on the other input lead 50 of AND gate 16, a "1" is produced on the output of said AND gate 16 which in turn performs two functions. The first function is to reset flip-flop 11 to produce a "0" on its output lead 50. The second function is to reset flip-flop 15 to produce a "1" on output lead 18. This is the end of the sequence and results in the production of a short-term positive pulse 106, as shown in FIG. 2E at the time of pulse 102, on output lead 17 of flip-flop 15. The foregoing sequence of events also functions to reset the flip-flop 11 to produce a "0" on its output 50 as shown in FIG. 2D.

The foregoing operation can be seen to produce a negative, or a lower level D-C voltage on output lead 17 of flip-flop 15, which D-C voltage is supplied through suitable filter means 35 and lead 28 to VCO 29 and will tend to pull $f_{vco}$ upwards toward $f_{ref}$.

It will be necessary for the $f_{vco}$ to actually exceed $f_{ref}$ in order for the transition of the circuit from frequency pull-in condition to phase lock condition to occur. More specifically, it is necessary that two pulses from the VCO, such as pulses 110 and 111 in FIG. 2A, occur between two consecutive pulses of the reference signal, such as pulses 108 and 109 of FIG. 2B, in order for such transition to occur. In the following paragraph the details of such transition will be discussed.

The function of pulse 110 produces the same effect as the pulses 100 or 102 of FIG. 2A and leaves the circuit with zeros on output 51 of flip-flop 10, output 50 of flip-flop 11, and output 17 of flip-flop 15. However, the pulse 111 changes the sequence of operation in the following manner. Pulse 111 is supplied from VCO 29 to flip-flop 10 and produces a "1" on the output lead terminal 51 of flip-flop 10. Since there is already a "1" on output lead 18 of flip-flop 15, as shown in FIG. 2E (the output of 18 is the inverse of the output of lead 17), the AND gate 14 will produce a "1" on its output which performs two functions. The first function is to reset flip-flop 10 to produce a "0" on its output lead 51 and the second function is to set flip-flop 15 to produce a "1" on its output lead 17. Since there was already a "0" on the output lead 50 of flip-flop 11 there is no output from AND gate 16 and this sequence of operation terminates.

The next pulse to be supplied to the system is the pulse 109 of FIG. 2B from reference source 30. As will be seen from the following discussion the pulse 109 will perform a new sequence of operation, which specifically is the phase lock-in sequence. In more detail, the pulse 109 functions to set flip-flop 11 to produce a "1" on the output lead 50 thereof. Since there was already a "1" on the input lead 20 thereof from output terminal 17, the AND gate 16 produces a "1" at its output which performs the function of resetting flip-flop 11 back to a "0" and resetting flip-flop 15 to produce a "1" on the output lead 18 thereof. A "1" on output lead 18 is equivalent to a "0" on output lead 17.

The next pulse supplied to the system is the pulse 112 of FIG. 2A from VCO 29 of FIG. 1. This pulse performs the following function. A "1" is produced on output lead 51 of flip-flop 10. Since there is already a "1" on output 18 of flip-flop 15, the AND gate 14 functions to produce a "1" at its output which resets flip-flop 10 to produce a "0" on its output 51, and also sets flip-flop 15 so that a "1" appears on the output lead 17 thereof as shown in FIG. 2E at the time of pulse 112 of FIG. 2A. Since at this time there is a "0" on output lead 50 of flip-flop 11, there is no output from AND gate 16.

The next pulse supplied to the system is pulse 114 of FIG. 2B and is supplied from the reference signal source 30. The pulse 114 sets flip-flop 11 to produce a "1" on output lead 50 thereof. Since a "1" already exists on the other input lead 20 of AND gate 16, there is produced a "1" on the output of AND gate 16 which functions to reset flip-flop 11 so that a "0" is produced on the output lead 50 thereof and also functions to reset flip-flop 15 to produce a "1" on output lead 18 thereof as shown in FIG. 2E at a time corresponding to pulse 114 of FIG. 2B.

The operation of FIG. 2B of the circuit is now in the phase lock condition, which condition began at time $t_2$ and extends through time $t_3$ in FIG. 2. In such phase lock condition the output signal appearing on output lead 17 of flip-flop 15 changes each time alternate pulses are supplied from VCO 29 and the reference signal source 30 of FIG. 1.

It can be seen that immediately after time $t_2$ and during the initial period of the phase lock condition the D-C component of the output signal on lead 17 is still lower than the midpoint between the upper and lower levels; said midpoint arbitrarily being assumed to be the value at which phase lock between the VCO and the reference signal will occur. Since the D-C component is below said midpoint $f_{vco}$ will continue to be slightly greater than $f_{ref}$, until such time as the phase of the VCO signal shifts sufficiently so that the D-C component appearing on lead 17 is substantially at the midpoint, which condition is shown in the waveforms of FIG. 2 as occurring about two cycles before time $t_3$. When the D-C voltage component reaches said midpoint, phase lock has occurred.

II. *From phase-lock condition to frequency pull-in where $f_{vco}>f_{ref}$*

Referring now to the waveforms of FIG. 3, the sequence of operation between time $t_4$ and $t_5$ is a continuation of the phase lock sequence existing between time $t_2$ and $t_3$ of FIG. 2.

Between time $t_5$ and $t_6$ in FIG. 3 there is shown a transition from the phase lock condition to frequency pull-in when $f_{vco}$ becomes greater than the reference signal frequency. Such frequency pull-in condition exists between time $t_6$ and time $t_7$. Between time $t_7$ and $t_8$ another transition occurs upon the completion of the frequency pull-in so that beginning at time $t_8$ the sequence of operation of the circuit performs the phase lock function.

The pulses 130 and 131 of FIGS. 3A and 3B perform essentially the same function as the pulses 114 and 112 of FIGS. 2A and 2C for example, except in reverse order, since they occur in reverse order as can be seen from the figures.

More specifically, the pulse 130 of FIG. 2B occurs at a time when there is a "0" on output lead 51 of flip-flop 10, a zero on the output 50 of flip-flop 11, and a "1" on output lead 17. The pulse 130 functions to produce a "1" on the output lead 50 and since there's already a "1" on the other input lead 20 to AND gate 16 there is a "1" produced on output of AND gate 16. The last mentioned "1" functions to reset flip-flop 11 to produce a "0" on output lead 50 and also to reset flip-flop 15 to produce a "1" on output lead 18.

The next occurring pulse 131 functions to produce a "1" on output lead 51 of flip-flop 10 which together with the "1" on output lead 18 activates AND gate 14 to reset flip-flop 10 and to set flip-flop 15 so that a "1" is produced on output lead 17.

The foregoing sequence is still a phase lock condition. Such phase lock condition changes, however, when the next pulse 134 occurs before another reference pulse, such as pulse 135 of FIG. 2B, occurs. Pulse 134, which is supplied from VCO 29 functions to produce a "1" on output lead 51 of flip-flop 10. Since at this time there is a "1" on lead 17 and a "0" at 18, AND gate 14 is not energized and the sequence terminates at that point. The next input pulse supplied to the system is pulse 135 from reference signal source 30 which functions to set flip-flop 11 to produce a "1" on output lead 50 thereof. Since a "1" already exists on the other input lead 20, AND gate 16 produces a "1" at its output which resets flip-flop 11 to a zero condition and also resets flip-flop 15 to provide a "1" on output lead 18.

There is already a "1" on lead 51 from the effect of pulse 134 of FIG. 2A. Thus AND gate 14 will produce a "1" at its output terminal which will reset flip-flop 10 to zero and set flip flop 15 to produce a "1" on output lead 17.

It will be observed that the potential on output lead 17 remains at its high level except for the duration of the short pulse 138 which occurs during the sequence of operation described immediately above in response to the reference pulse 135 of FIG. 2B.

The next pulse supplied to the system is pulse 140 from VCO 29, which pulse functions to set flip-flop 10 to produce a "1" on output lead 51. A "0" at this time exists on output lead 18 so there is no output from AND gate 14 and the sequence ends. The next supplied pulse is pulse 141 from reference source 30, which performs the same function as the previous reference pulse 135. More specifically, pulse 141 sets flip-flop 11 to produce a "1" on output lead 50 which, together with the "1" already existing on output lead 17 of flip-flop 15, produces a "1" on the output of AND gate 16. The last mentioned "1" functions to reset flip-flop 11 to zero and to reset flip-flop 15 to produce a "1" on output lead 18. Since there is already a "1" on lead 51 AND gate 14 functions to reset flip-flop 10 and to set flip-flop 15, thus putting a "1" on output 17.

The overall result above the above sequence is a substantially upper level signal appearing on output lead 17, as can be seen from FIG. 2E between times $t_6$ and $t_7$.

It should be observed that a transition from phase-lock condition between times $t_4$ and $t_5$ to the frequency pull-in condition between times $t_6$ and $t_7$ occurs because $f_{vco}$ for some reason increased above $f_{ref}$. Such an increase in $f_{vco}$ resulted ultimately in the occurrence of two pulses 131 and 134 of FIG. 3A between two adjacent reference signal pulses 130 and 135.

III. *Frequency pull-in from $f_{vco}>f_{ref}$ to phase-lock condition*

Because of the positive nature of the output voltage on output lead 17 of flip-flop 15, which is supplied back through filter 30 to VCO 29, $f_{vco}$ is gradually decreased as shown in FIG 2A between times $t_6$ and $t_7$. Such decrease in $f_{vco}$ ultimately results in the occurrence of two reference signal pulses 151 and 153 between two adjacent VCO pulses 150 and 152 of FIG. 3A. Such an occurrence results in a transition of the sequence of operation of the circuit of FIG. 1 to the phase lock condition shown between times $t_8$ and $t_9$ and occurs in the following manner.

The pulses 150 and 151 perform much the same function as the pulses 134 and 141 of FIGS. 2A and B, respectively, which function was described in the immediately preceding paragraphs. However, the next pulse presented to the system is not another pulse from the VCO 29 of FIG. 1, but rather a second pulse 153 from reference signal source 30. Such pulse 153 enters the system under the following conditions. There is a "0" on output lead 51 of flip-flop 10, a "0" on output lead 50 of flip-flop 11 and a "1" on output lead 17 of flip-flop 15. The occurrence of input pulse 153 sets flip-flop 11 to produce a "1" on output lead 50, which together with the existing "1" on output lead 17 of flip-flop 15 produces a "1" from AND gate 16 to reset flip-flop 11 to produce a "0" on output lead 50 and to reset flip-flop 15 to produce a "1" on output lead 18.

The next pulse entering the system is pulse 152 from VCO source 29 which functions to set flip-flop 10 to produce a "1" on output lead 51, which together with the existing "1" on outut terminal 18, produces a "1" at the output of AND gate 14. Such an output resets flip-flop 10 to produce a "0" on lead 51 and sets flip-flop 15 to produce a "1" on output lead 17.

The net result of the above sequence is that the output signal on terminal 17 has been changed from a low level to a high level.

The next input pulse in the system is pulse 157 from reference signal source 30 which functions to set flip-flop 11 to produce a "1" on output terminal 50 which, together with the existing "1" on output terminal 17, activates AND gate 16 to reset flip-flop 11 to its "0" condition and to reset flip-flop 15 to produce a "1" on output terminal 18. Again it is to be noted that the overall result is to change the level of the output voltage appearing on terminal 17. Thus it can be seen that with each pulse supplied to the system from the VCO source 29 and the reference signal source 30, as long as those pulses occur in an alternate fashion, the output voltage on terminal 17 will simply change levels with each pulse, which is the characteristic of the phase lock condition. The D-C component of the signal appearing on output terminal 17, as shown in FIG. 3E between time $t_8$ and $t_9$, can be seen to approach the midpoint at which time phase lock will occur in the same manner described in connection with the operation of the circuit between time $t_2$ and $t_3$ of FIG. 2.

It is to be understood that the form of the invention shown and described in the specification is but a preferred embodiment thereof and that various changes may be made in the logic, particularly in the type of flip-flop circuits employed without departing from the spirit or scope thereof.

I claim:

1. Digitalized frequency and phase discriminator means for controlling the frequency $f_{vco}$ of a first signal from a variable controlled oscillator to the frequency $f_{ref}$ of a reference signal and comprising:
- first and second bistable means each having first and second input means and first output means and constructed to produce on said output means an output signal having first and second levels in accordance with the condition of said bistable means;
- third bistable means having first and second input means and first and second output means;
- said first and second bistable means responsive to said first signal and to said reference signal, respectively, to assume their first states;
- first and second gating means constructed, when energized, to produce first and second output signals, respectively;
- said third bistable means responsive to an output signal from said first and second gating means, respectively, to assume its first and second stable states, respectively;
- said first gating means responsive to said first state of said first bistable means and to the first state of said third bistable means to produce a first output signal;
- said second gating means responsive to said first state of said second bistable means and to a second state of said third bistable means to produce a second output signal;
- said first and second bistable means responsive respectively to said first and second output signals of said first and second gating means to assume their second states.

2. Digitalized frequency and phase discriminator means for controlling the frequency $f_{vco}$ of a signal $e_{vco}$ from a variable controlled oscillator to the frequency $f_{ref}$ of a reference signal $e_{ref}$ and comprising:
- first, second, and third bistable devices each having first and second input means which, when energized, produce first and second states of said bistable devices;
- said first and second bistable devices responsive, respectively, to each cycle of $e_{vco}$ and to each cycle of $e_{ref}$ to assume said first states;
- first gating means responsive to first states of said first and third bistable means to produce a first output signal;
- second gating means responsive to first and second states, respectively, of said second and third bistable means to produce a second output signal;
- said first and second bistable means responsive to said first and second output signals to assume said second states; and
- said third bistable means responsive to said first and second output signals to assume said second and first states, respectively.

3. Frequency and phase discriminator means in accordance with claim 2 in which:
- said third bistable means comprises an output terminal on which appears a first or second voltage level in accordance with the state of said third bistable means and containing a D-C component of the proper polarity to cause the frequency of the output signal of said variable controlled oscillator to move toward said reference frequency $f_{ref}$;

and comprising:
- filter means responsive to said first and second voltage levels to extract the D-C signal component therefrom and supply said D-C component to said variable controlled oscillator;
- said variable controlled oscillator constructed to respond to said D-C voltage to change its frequency toward the frequency $f_{ref}$.

4. Digitalized frequency and phase discriminator means for controlling the frequency $f_{vco}$ of a signal $e_{vco}$ from a variable controlled oscillator to the frequency $f_{ref}$ of a reference signal $e_{ref}$ and comprising:
- first, second, and third bistable means each having first and second stable states;
- said first and second bistable means responsive to each cycle of $e_{vco}$ and $e_{ref}$, respectively, to assume their first stable states;
- first and second gating means responsive, respectively, to concurrent first states of said first and third bistable means, and to concurrent first and second states of said second and third bistable means, respectively, to produce first and second output signals, respectively;
- said first and second bistable means responsive to said first and second output signals, respectively, to assume their second states; and
- said third bistable means responsive to said first and second output signals to assume its second and first state, respectively.

5. Frequency and phase discriminator means in accordance with claim 4 in which:
- said third bistable means comprises an output terminal on which appears a first or second voltage level in accordance with the state of said third bistable means and containing a D-C component of the proper polarity to cause the frequency of the output signal of said variable controlled oscillator to move toward said reference frequency $f_{ref}$;

and comprising:
- filter means responsive to said first and second voltage levels to extract the D-C signal component therefrom and supply said D-C component to said variable controlled oscillator;
- said variable controlled oscilaltor constructed to respond to said D-C voltage to change its frequency toward the frequency $f_{ref}$.

6. Means for indicating relative frequency values between a first signal $e_1$ having a frequency $f_1$ and second signal $e_2$ having a frequency $f_2$ and comprising:

first, second, and third bistable means each having first and second stable states;

said first and second bistable means responsive to each cycle of $e_1$ and $e_2$, respectively, to assume their first stable states;

first and second gating means responsive, respectively, to concurrent first states of said first and third bistable means, and to concurrent first and second states of said second and third bistable means, respectively, to produce first and second output signals, respectively;

said first and second bistable means responsive to said first and second output signals, respectively, to assume their second states; and said third bistable means responsive to said first and second output signals to assume its second and first state, respectively.

7. Means for indicating relative frequency values between a first signal $e_1$ having a frequency $f_1$ and a second signal $e_2$ having a frequency $f_2$, and comprising:

first, second, and third bistable devices each having first and second input means which, when energized produce first and second states of said bistable devices;

said first and second bistable devices responsive, respectively, to each cycle of $e_1$ and to each cycle of $e_2$ to assume said first states;

first gating means responsive to first states of said first and third bistable means to produce a first output signal, second gating means responsive to first and second states, respectively, of said second and third bistable means to produce a second output signal;

said first and second bistable means responsive to said first and second output signals to assume said second states; and said third bistable means responsive to said first and second output signals to assume said second and first states, respectively.

References Cited

UNITED STATES PATENTS

| | | | |
|---|---|---|---|
| 3,205,438 | 9/1965 | Buck | 328—133 X |
| 3,328,688 | 6/1967 | Brooks | 324—83 |
| 3,383,619 | 5/1968 | Naubereit et al. | 331—27 |

JOHN KOMINSKI, *Primary Examiner.*

SIEGFRIED H. GRIMM, *Assistant Examiner.*

U.S. Cl. X.R.

324—83; 328—133; 331—27